United States Patent
Rankin et al.

(10) Patent No.: US 7,491,476 B1
(45) Date of Patent: Feb. 17, 2009

(54) PHOTOMASK ELECTRICAL MONITOR FOR PRODUCTION PHOTOMASKS

(75) Inventors: Jed Hickory Rankin, Richmond, VT (US); Brent Alan Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/104,044

(22) Filed: Apr. 16, 2008

(51) Int. Cl.
G03F 1/00 (2006.01)
G01R 27/08 (2006.01)

(52) U.S. Cl. .......................... 430/5; 324/699
(58) Field of Classification Search ............ 430/5, 430/30, 394; 324/699, 713, 714, 765; 438/10; 356/124.5
See application file for complete search history.

(56) References Cited

U.S. PATENT DOCUMENTS

| | | |
|---|---|---|
| 6,362,634 B1 | 3/2002 | Jarvis et al. |
| 6,762,434 B2 | 7/2004 | Rumsey et al. |
| 6,835,502 B2 | 12/2004 | Hibbs |
| 6,972,576 B1 * | 12/2005 | Lyons et al. ............... 324/699 |
| 2005/0164096 A1 | 7/2005 | Hong et al. |
| 2006/0234144 A1 | 10/2006 | Watson et al. |
| 2006/0290919 A1 | 12/2006 | Jahnke et al. |
| 2007/0132445 A1 | 6/2007 | Liegl |

FOREIGN PATENT DOCUMENTS

SU 1302138 A 4/1987

OTHER PUBLICATIONS

Wagner, Fabrication of a Focus Monitor for Photomasks, TDB v38 n5 May 1995 p. 1-2.

* cited by examiner

*Primary Examiner*—Stephen Rosasco
(74) *Attorney, Agent, or Firm*—PRTSI, Inc.; Martin D. Moynihan

(57) ABSTRACT

The present invention relates to a method, apparatus, and system for monitoring photomasks used in the production of semiconductor wafers for defects, degradation or a combination thereof. The invention provides an integrated test structure on the photomask itself and a method of positioning the test structure in conjunction with the photomask for a masking layer of an integrated circuit. The integrated test structures provide for an in-situ electrical or electromagnetic monitor on the photomask that doesn't adversely affect the integrated semiconductor devices on the wafers during the lithographic masking process.

1 Claim, 3 Drawing Sheets

PHOTOMASK ELECTRICAL MONITOR FOR PRODUCTION PHOTOMASKS

FIELD OF INVENTION

The invention lies in the area of semiconductor photomask monitoring for defects and/or degradation.

BACKGROUND

Photolithographic photomasks are critical for the precise transfer and fabrication of shapes onto a semiconductor wafer. Such photomasks are used repeatedly in a photolithographic exposure tool to produce many wafers.

Over time, the photomasks may develop defects. This may be due to oxide growth of the photomasking films, physical degradation due to optical and environmental exposure, chemical contamination, chemical gettering, handling or any combination of the aforementioned activities.

To prevent the fabrication of defective wafers resulting from a defective or degraded photomask, either the photomask or the wafers need to be inspected or monitored. To do this, there are many techniques known in the art.

One such technique is the periodic inspection of the photomasks after, say, several hundred wafer passes. The problem with this technique is that the photomask inspection requires high-sensitivity inspection tools which are usually maintained in the photomask fabrication facility and not usually operated in the semiconductor production environment.

Another technique is the monitoring of the wafers themselves. One way to do that is by correlating photo limited yield (PLY) data with defective or degraded photomasks. Another way would be to look at the product using a critical dimension scanning electron microscope (CDSEM). The problem with these techniques is that it is both time consuming and is not timely in catching the problem when it starts to occur. Additionally, they only detect the problem when it is relatively severe, while it may begin to have an electrical impact on performance or yield prior to this point.

SUMMARY

The present invention is directed to a method, apparatus, and system for monitoring a semiconductor photomask for defects, said photomask comprising an isolation frame, a kerf or scribe line area, a printed area containing one or more patterns representing one masking layer of an integrated circuit, and a non-printed area outside of the isolation frame. Defects may develop over time during use of the photomask in producing images on substrates. Examples of causes of photomask defects that develop during image production on substrates are degradation due to wear or handling, particle contamination, physical damage from photomask contact with people, product or tooling, corrosion and oxidation. One or more integrated test structures are integrated on the photo mask. The one or more integrated test structures may be resistive, capacitive, electro-optical, electro-mechanical, a transistor circuit, piezo-electric, magneto-resistive, photo-diode, or defect monitor test structures or any combination thereof. The monitoring consists of treating the one or more test structures with electrical stimulus to produce at least one of electrical output signal values and electromagnetic output signal values and then measuring, at one or more predetermined intervals during production of imaged substrates using the photomask, the at least one output signal value produced by the one or more test structures, obtaining at least one measured value. Measuring comprises sensing or probing the one or more integrated test structures, which are located on the photo mask surface. The measured values obtained are compared to a predetermined threshold value and the photomask is rejected for further production use if any of the at least one measured value exceeds the threshold value it is compared to. Once rejected, corrective action may be taken. Examples of such corrective actions may be photomask cleaning, photomask repair, photomask replacement, lithographic tool adjustments, environmental adjustments, and product sorting.

The location of the test structures on the photomask may be in the kerf or scribe line area within the isolation frame or in the non-printed area outside the isolation frame or in both areas. If the test structure is located in the kerf or scribe line area within the isolation frame and is to be electrically probed, one or more leads connected, at one end, to the one or more test structures will be routed through one or more gaps in the isolation frame to connect, at the other end, to one or more probe pads located in an area which is outside the isolation frame. The exposed portions of all probe leads where they are located within the one or more gaps in the isolation frame are capped with an electrically insulating and actinically opaque material, which serves to optically close the one or more gaps in the isolation frame.

DETAILED DESCRIPTION

Figure 1:
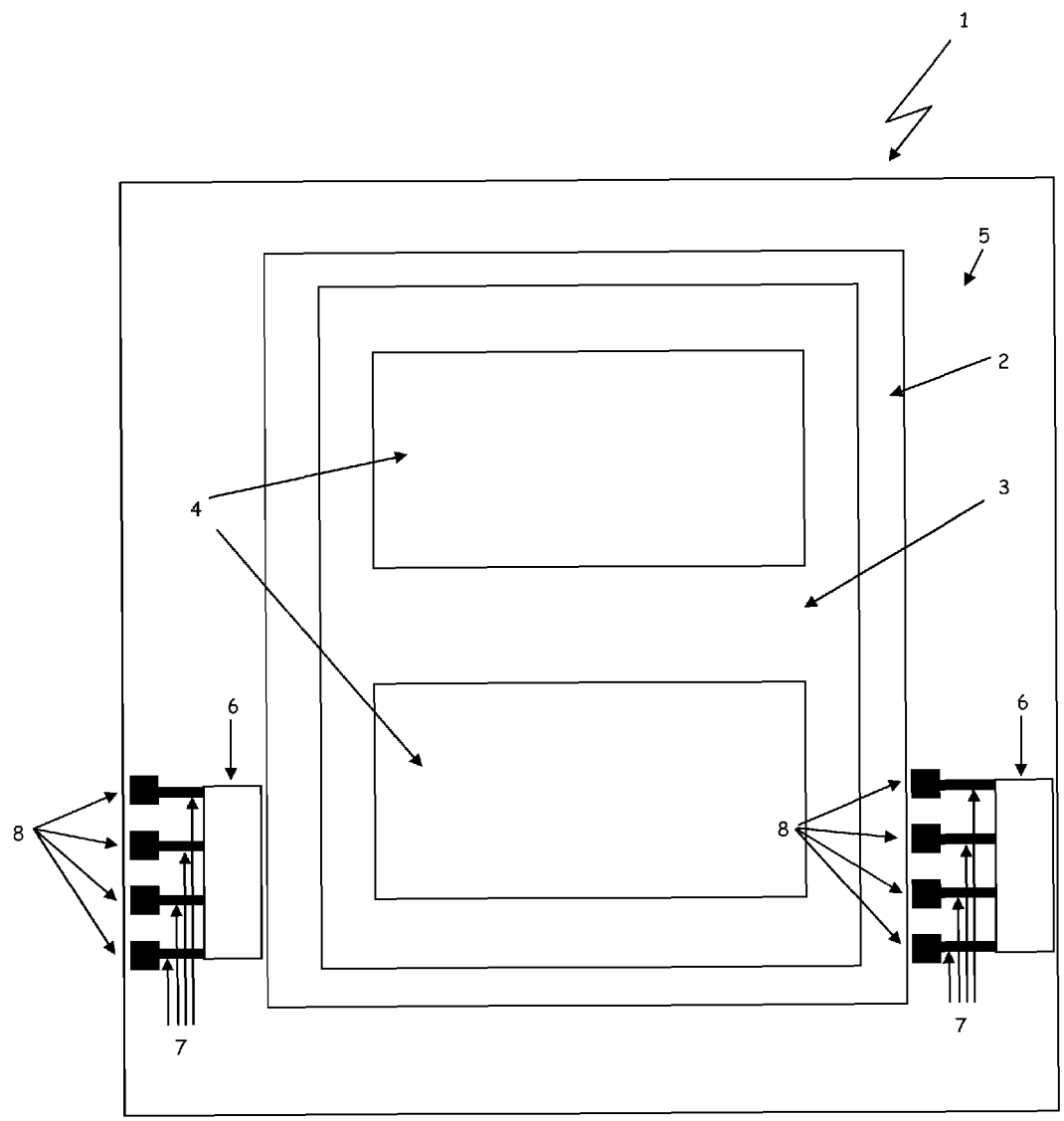
FIG. 1 shows a photomask with test structures outside of printed area
Figure 2:
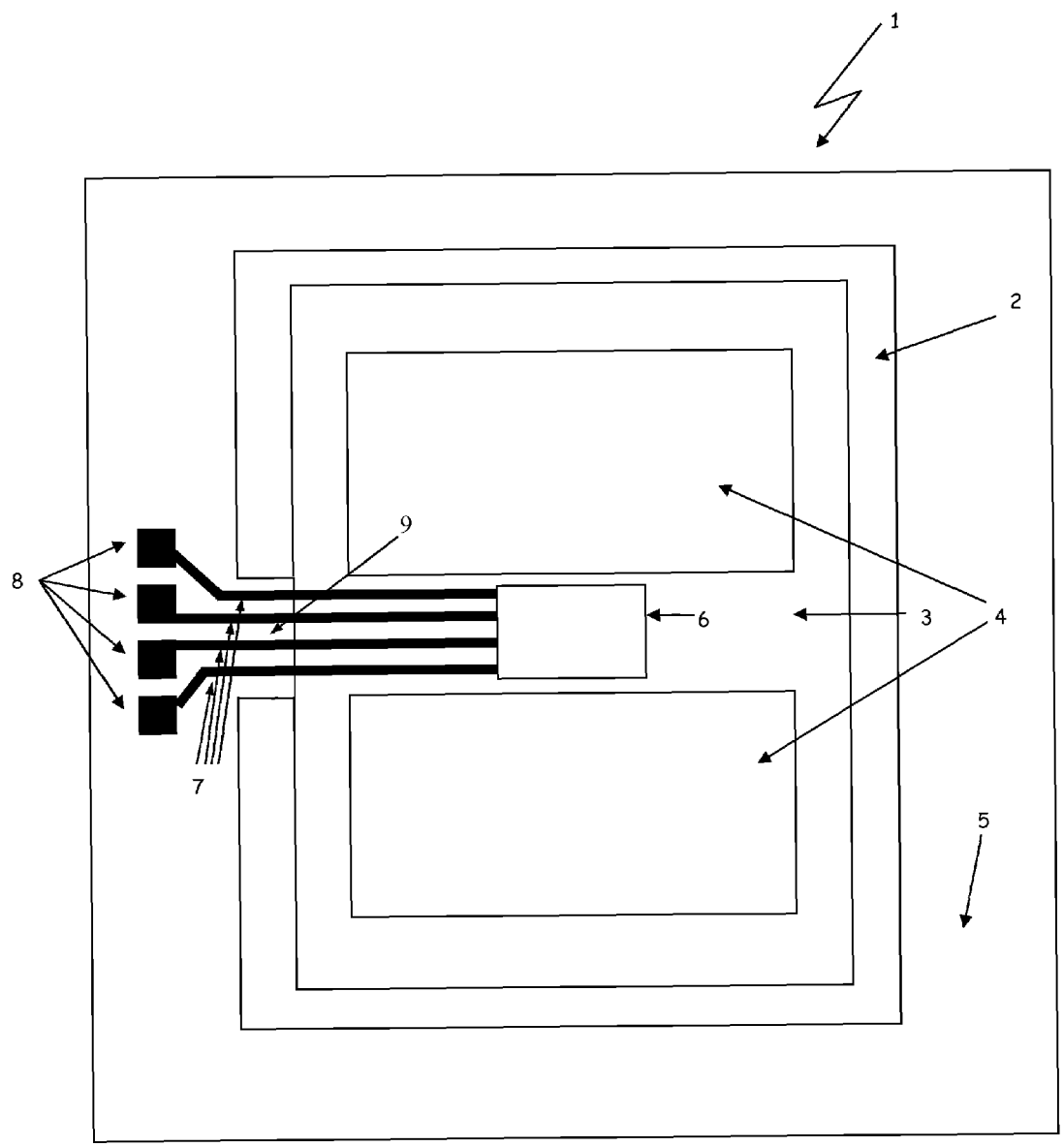
FIG. 2 shows a photomask with test structures within the kerf or scribe area
Figure 3:
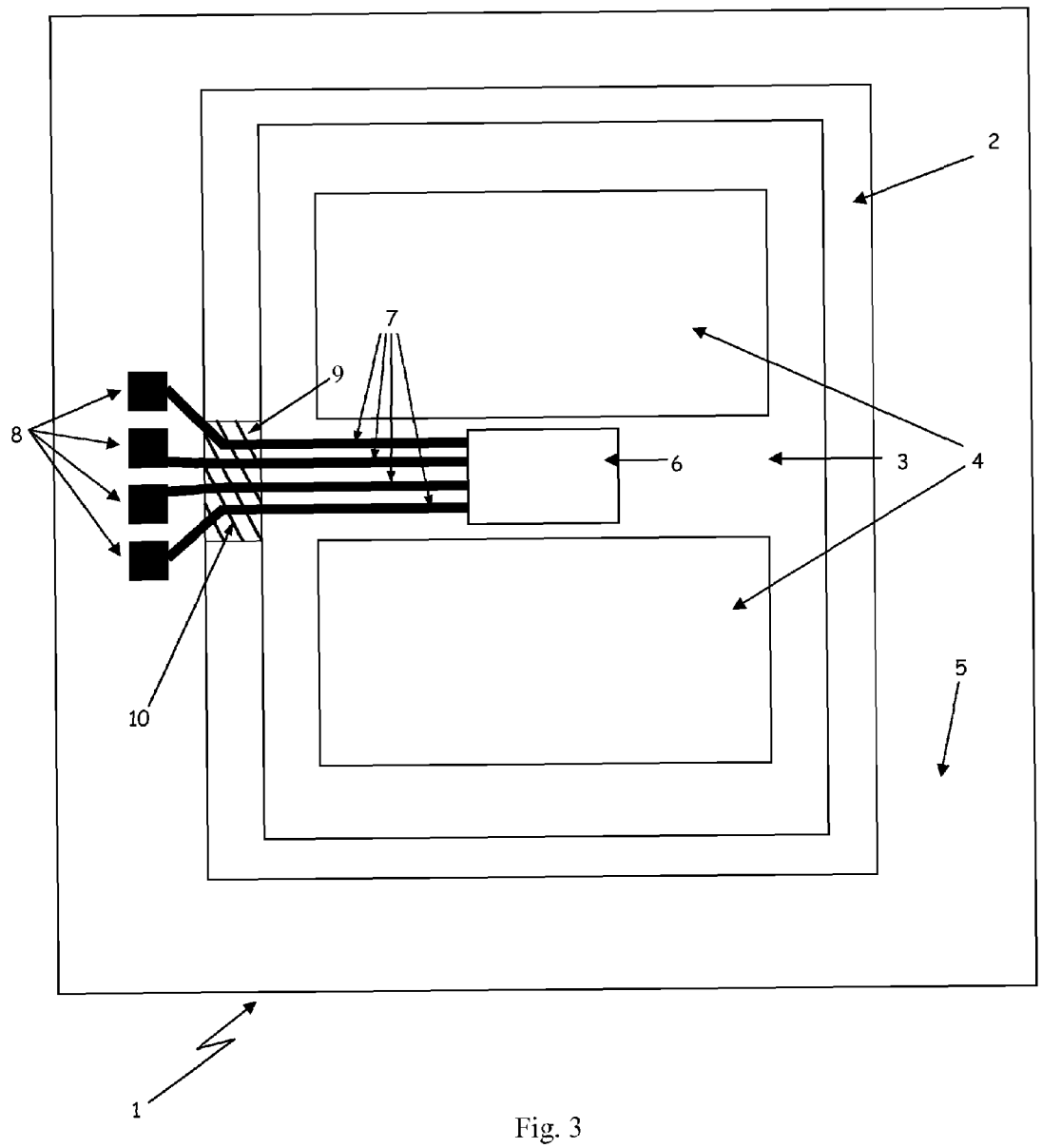
FIG. 3 shows a photomask with test structures within the kerf and scribe area and the test leads capped with insulator.

Exemplary embodiments of the current invention are shown in FIGS. 1, 2, and 3. In a first exemplary embodiment illustrated in FIG. 1, a photomask 1 is shown, comprising a isolation frame 2, a kerf or scribe line area 3 and a printed area 4 containing one or more patterns representing one masking layer of an integrated circuit. Outside the isolation frame 2, lies non-printed area 5, which contains no patterns, intended for transfer to the semiconductor wafer during lithographic processing. In this embodiment, test structures 6 are formed in the non-printed area 5. Connected to each test structure are multiple probe leads 7 connecting the test structures 6, on one end, to probe pads 8, on the other end. The test structures 6, the probe leads 7 and the probe pads 8 all lay within the non-printed area 5 located outside of the isolation frame 2.

In a second exemplary embodiment illustrated in FIG. 2, a photomask 1 is shown, comprising a isolation frame 2, a kerf or scribe line area 3 and a printed area 4 containing one or more patterns representing one masking layer of an integrated circuit. Outside the isolation frame 2 lies non-printed area 5. In this embodiment, a test structure 6 is printed in the kerf or scribe area 3. Connected to the test structure are multiple probe leads 7 connecting the test structure 6, on one end, to probe pads 8, on the other end. The test structures 6, as stated above, resides in the kerf or scribe area 3, while the probe pads 8 lie within the non-printed area 5 located outside of the isolation frame 2. To accommodate the passage of the probe leads 7 from the kerf and scribe area 3 to the non-printable area 5, a gap 9 is opened in the isolation frame 2.

In a third exemplary embodiment illustrated in FIG. 3, a photomask 1 is shown, comprising an isolation frame 2, a kerf or scribe line area 3 and a printed area 4 containing one or more patterns representing one masking layer of an integrated circuit. Outside the isolation frame 2 lies non-printed area 5. In this embodiment, a test structure 6 is printed in the kerf or scribe area 3. Connected to the test structure are multiple probe leads 7 connecting the test structure 6, on one end, to probe pads 8, on the other end. The test structures 6, as stated above, resides in the kerf or scribe area 3, while the probe pads 8 lie within the non-printed area 5 located outside of the isolation frame 2. To accommodate the passage of the probe leads 7 from the kerf or scribe area 3 to the non-printed area 5, a gap 9 is opened in the isolation frame 2. Following the forming of the probe leads 7 through the gap 9 in the isolation frame 2, the portions of the leads 7 in the gap 9 are capped with an electrically insulating material 10 which is opaque to the radiation used to lithographically expose the photomask. Alternately, the probe leads 7 may be electrically isolated by first capping with an electrically insulative film, followed by an electrically conductive, but optically opaque material, such as chrome.

The test structures used for photomask monitoring may be any type of electrical, electro-optical, electro-mechanical structure. The test structures may be formed of passive devices such as capacitive, resistive, or interleaved wiring patterns. They may also be formed of active devices, such as transistors, piezo-electric devices, magneto-resistive devices, photo-diodes, etc.

Following the excitation of the test structure with electrical stimulus, the test structures may be electrically probed using probe leads and pads as described in the exemplary embodiments or sensed using test structures that emit optical or electro-magnetic signals such as infrared (IR), radio frequency (RF) or light.

In any case, the integrated test structures may be probed or sensed in-situ on the production floor. The signals measured by the probe or sensing equipment may then be used to determine if any corrective action need be taken. For example the measured values may be compared to threshold or limit values correlated to the condition of the photomask relating to defects or degradation or a combination thereof. When comparison of the measured signal or signals to the threshold or limit value or values result in the measured value or values exceeding the threshold or limit value or values, production may be halted and corrective action relating to the photomask may be taken. Examples of corrective actions are photomask cleaning, photomask repair, photomask replacement, lithographic tool adjustments, environmental adjustments, and product sorting.

The invention claimed is:

1. A method for monitoring a functional semiconductor photomask for degradation of the photomask that may develop over time during use of the photomask for production of images on substrates, said photomask comprising an isolation frame, a kerf or scribe line area within the isolation frame, a printed area within the isolation frame, said printed area containing one or more patterns representing one masking layer of an integrated circuit, and a non-printed area outside of the isolation frame, said method comprising:

providing one or more test structures integrated on the photomask, said one or more test structures selected from a group consisting of resistive, capacitive, electro-optical, electro-mechanical, transistor circuit, piezo-electric devices, magneto-resistive devices, photo-diodes, and defect monitor test structures, said one or more test structures provided in at least one of the kerf or scribe line area, the photomask non-printed area, and both the kerf or scribe line area and photomask non-printed area;

placing the functional photomask into the production of imaged substrates;

treating the one or more test structures with electrical stimulus to produce at least one of electrical output signal values and electromagnetic output signal values;

measuring, at one or more predetermined intervals during production of the imaged substrates using the photomask, the at least one output signal value produced by the one or more test structures, to obtain at least one measured value; and comparing each of the at least one measured value to a predetermined threshold value and rejecting the photomask for further imaged substrate production use if any of the at least one measured value exceeds the threshold value it is compared to.

* * * * *